US009103986B2

(12) United States Patent
Margalit (10) Patent No.: US 9,103,986 B2
(45) Date of Patent: Aug. 11, 2015

(54) MULTI FREQUENCY FILTER ARRAYS FOR LOW COST SPECTROMETERS

(75) Inventor: Mordehai Margalit, Zichron Yaaqov (IL)

(73) Assignee: Empire Technology Development LLC, Wilmington, DE (US)

( * ) Notice: Subject to any disclaimer, the term of this patent is extended or adjusted under 35 U.S.C. 154(b) by 151 days.

(21) Appl. No.: 13/637,206

(22) PCT Filed: Jun. 8, 2012

(86) PCT No.: PCT/US2012/041635
§ 371 (c)(1),
(2), (4) Date: Sep. 25, 2012

(87) PCT Pub. No.: WO2013/184136
PCT Pub. Date: Dec. 12, 2013

(65) Prior Publication Data
US 2013/0329116 A1   Dec. 12, 2013

(51) Int. Cl.
*H04N 9/07* (2006.01)
*H04N 5/225* (2006.01)
*G02B 5/28* (2006.01)
*G03F 7/00* (2006.01)
*H01L 27/146* (2006.01)

(52) U.S. Cl.
CPC ............... *G02B 5/285* (2013.01); *G02B 5/287* (2013.01); *G02B 5/288* (2013.01); *G03F 7/0007* (2013.01); *H01L 27/14621* (2013.01); *H01L 27/14627* (2013.01); *Y10T 29/49826* (2015.01)

(58) Field of Classification Search
USPC ......................................... 348/290–292, 342
See application file for complete search history.

(56) References Cited

U.S. PATENT DOCUMENTS

| 5,044,736 | A | | 9/1991 | Jaskie et al. |
| 5,096,298 | A | | 3/1992 | Isobe |
| 5,633,966 | A | * | 5/1997 | Nakaishi .......................... 385/37 |
| 5,726,805 | A | | 3/1998 | Kaushik et al. |
| 7,099,075 | B2 | | 8/2006 | Ratowsky et al. |
| 7,199,927 | B2 | | 4/2007 | Uehara |
| 7,405,761 | B2 | | 7/2008 | Feldman et al. |
| 7,521,666 | B2 | * | 4/2009 | Tsang ............................ 250/226 |
| 7,901,870 | B1 | * | 3/2011 | Wach ............................. 430/321 |
| 2005/0174664 | A1 | * | 8/2005 | Ito et al. ........................ 359/883 |

(Continued)

OTHER PUBLICATIONS

International Search Report and Written Opinion for PCT/US2012/041635 dated Aug. 28, 2012.

(Continued)

*Primary Examiner* — Sinh Tran
*Assistant Examiner* — Shahbaz Nazrul
(74) *Attorney, Agent, or Firm* — Pepper Hamilton LLP (57) ABSTRACT

Optical filters, optical sensor arrays and methods for assembling the same and systems incorporating the same are disclosed. An optical filter may include a first stack, a second stack and a spacer layer. The first stack may include alternating layers of a first material having a first refractive index and a second material having a second refractive index that differs from the first refractive index. The second stack may include alternating layers of the first material and the second material. The spacer layer may be positioned between the first stack and the second stack to form a stacked assembly. The spacer layer may include a patterned layer including the first material and the second material. At least a portion of the patterned layer may include a pattern composed of the first material.

29 Claims, 3 Drawing Sheets

(56) References Cited

U.S. PATENT DOCUMENTS

| | | | |
|---|---|---|---|
| 2006/0039062 A1* | 2/2006 | Horikoshi | 359/359 |
| 2008/0062359 A1* | 3/2008 | Inaba et al. | 349/105 |
| 2008/0135740 A1* | 6/2008 | Matsuda et al. | 250/226 |
| 2008/0304156 A1* | 12/2008 | Koyama | 359/588 |
| 2009/0244686 A1 | 10/2009 | Djordjev | |
| 2010/0044746 A1 | 2/2010 | Steenbruggen | |
| 2010/0091225 A1* | 4/2010 | Cho et al. | 349/105 |
| 2010/0188737 A1* | 7/2010 | Terada | 359/359 |
| 2010/0322559 A1* | 12/2010 | Ogawa et al. | 385/37 |
| 2011/0032398 A1 | 2/2011 | Lenchenkov | |
| 2011/0181818 A1* | 7/2011 | Minato et al. | 349/106 |
| 2011/0242662 A1* | 10/2011 | Momoki et al. | 359/586 |
| 2011/0279901 A1* | 11/2011 | Watanabe | 359/589 |
| 2012/0086949 A1* | 4/2012 | Gao et al. | 356/521 |
| 2012/0298867 A1* | 11/2012 | Nishikawa et al. | 250/338.3 |

OTHER PUBLICATIONS

Huo et al., Microlens performance limits in sub-2μm pixel CMOS image sensors, *Optics Express* (Mar. 15, 2010), 18(6):5861-5872.

Inoue et al., Polarization independent visible color filter comprising an aluminum film with surface-plasmon enhanced transmission through a subwavelength array of holes, *Applied Physics Letters* (2011), 98:093113-1-093113-3.

Interference Filters: The Key to It All, http://www.fluorescence.com/tutorial/int-filt.htm (Printed from Internet Sep. 6, 2012).

Spectrometer, http://en.wikipedia.org/wiki/Spectrometer (Printed from Internet Sep. 19, 2012).

Yang et al., Integrated 2D photonic crystal stack filter fabricated using nanoreplica molding, *Opticals Express* (May 24, 2011), 18(11):11846-11858.

\* cited by examiner

MULTI FREQUENCY FILTER ARRAYS FOR LOW COST SPECTROMETERS

CROSS-REFERENCE TO RELATED APPLICATIONS

This application is a U.S. national stage filing under 35 U.S.C. §371 of International Application No. PCT/US 12/41635 filed Jun. 8, 2012 entitled "Multi-Frequency Filter Arrays for Low Cost Spectrometers," the disclosure of which is incorporated by reference in its entirety.

BACKGROUND

Spectroscopy is a well-known method for investigating and determining a chemical composition of a sample, whether in solid, liquid or gaseous form. A fine laser, typically a single mode laser operating at a single wavelength, is directed at the sample. A scattered signal is collected through an optical probe and analyzed in a high resolution spectrometer. However, high resolution spectrometers are large and expensive. In a typical spectroscopy device, the spectrometer accounts for more than 75% of the cost and a similar percentage of the size and weight of the device.

Typically, high resolution spectroscopes are large and expensive. It is an ongoing task to reduce the size and cost of spectroscopy by using arrays of detectors, either as complementary metal-oxide semiconductors (CMOS), charge-coupled devices (CCDs) or using no silicon materials.

However, there are still no low cost filter arrays, where each filter has a different center wavelength. Filters are typically manufactured by stacking alternating thin film coatings. The thickness and composition of the materials defines the filter spectrum characteristics. But, with standard manufacturing techniques, there is no way to make a cheap filter array having unique filters with different center wavelengths.

SUMMARY

In an embodiment, an optical filter for filtering a wavelength of interest may include a first stack including alternating layers of a first material having a first refractive index and a second material having a second refractive index that differs from the first refractive index, a second stack comprising alternating layers of the first material and the second material, and a spacer layer positioned between the first stack and the second stack to form a stacked assembly. The spacer layer may include a patterned layer that includes the first material or the second material. At least a portion of the patterned layer may include a pattern.

In an embodiment, a method of assembling an optical filter for filtering a wavelength of interest may include assembling a first stack comprising alternating layers of a first material having a first refractive index and a second material having a second refractive index that differs from the first refractive index, assembling a second stack comprising alternating layers of the first material and the second material, assembling a spacer layer configured to filter the wavelength of interest, and assembling a stacked assembly comprising the first stack, the second stack, and the spacer layer positioned between the first stack and the second stack. The spacer layer may include a patterned layer that includes the first material or the second material. At least a portion of the patterned layer may include a pattern.

In an embodiment, an image sensor array may include a plurality of photodiodes; a plurality of lenses, where each of the photodiodes corresponds to at least one of the plurality of lenses, and a plurality of filters, where each of the lenses corresponds to at least one of the plurality of filters. Each of the filters may include a first stack including alternating layers of a first material having a first refractive index and a second material having a second refractive index that differs from the first refractive index, a second stack including alternating layers of the first material and the second material, and a spacer layer positioned between the first stack and the second stack to form a stacked assembly. The spacer layer may include a patterned layer including the first material or the second material. At least a portion of the patterned layer may include a pattern. The spacer layer may be configured to filter the wavelength of interest.

In an embodiment, a system may include a first lens, an image sensor array positioned adjacent the first lens, and a processing device operably connected to the image sensor array. The first lens may be configured to receive incoming light, focus the incoming light, and transmit the focused light. The image sensor array may be configured to receive the focused light and output information related to the focused light. The image sensor array may include a plurality of photodiodes, a plurality of second lenses, where each of the photodiodes corresponds to at least one of the plurality of second lenses, and a plurality of filters, where each of the second lenses corresponds to at least one of the plurality of filters. Each of the filters may include a first stack including alternating layers of a first material having a first refractive index and a second material having a second refractive index that differs from the first refractive index, a second stack comprising alternating layers of the first material and the second material, and a spacer layer positioned between the first stack and the second stack to form a stacked assembly. The spacer layer may include a patterned layer including the first material or the second material. At least a portion of the patterned layer may include a pattern. The spacer layer may be configured to filter the wavelength of interest. The processing device may be configured to receive the output information related to the focused light, and generate an image based upon the output information.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

The present disclosure relates to an optical filter stack for use in a filter array. The filter may be primarily composed of a stack of alternating materials. The alternating materials may be a first material with a high refractive index and a second material with a lower refractive index. For example, materials with a high refractive index may include silicon nitride, titanium dioxide, zinc oxide, aluminum oxide, and/or other similar materials with a high refractive index. Materials with a low refractive index may include silicon dioxide, cryolite, polycarbonate, and/or other similar materials with a low refractive index.

Figure 1:
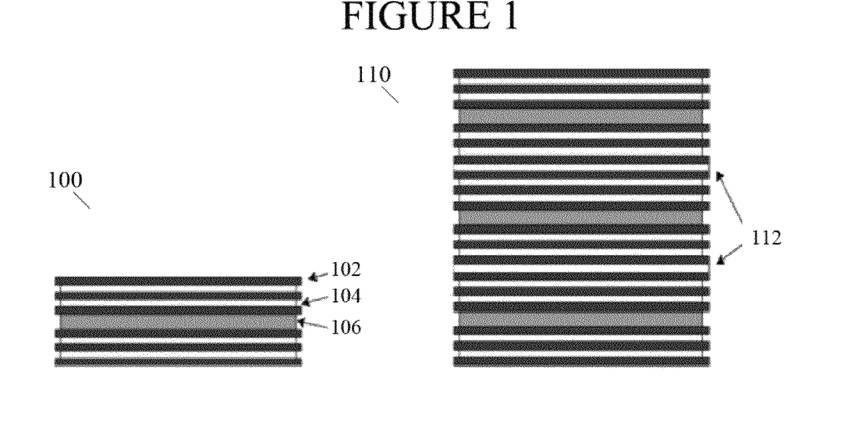
FIG. 1 depicts a single-cavity bandpass filter and a three-cavity bandpass filter according to an embodiment.

The thickness of the individual layers of the stack may be, for example and without limitation, ¼ λ, where λ is a wavelength of interest to be filtered. For example, a wavelength of interest may be a wavelength of about 600 nm to about 900 nm. The wavelength of interest may vary depending on the application of the filter. An example of such as stack is shown in FIG. 1. A stack may include a ¼λ high refractive index layer 102 and a ¼ λ low refractive index layer 104. This arrangement results in a Bragg mirror configured to reflect light centered at λ.

To produce a filter, such as a transmissive notch filter, two such stacks are combined with a spacer layer 106. The height of the spacer layer 106 may be about ½ λ. A resulting stacked assembly 100, such as the assembly shown in FIG. 1, may be a single-cavity bandpass filter.

To produce a higher order filter, multiple single-cavity bandpass filters may be combined. As shown in FIG. 1, a three-cavity bandpass filter 110 may be made from multiple single-cavity bandpass filters, each separated by a coupling layer 112.

In common applications, identification and filtering of multiple frequencies is of interest. For example, a spectroscope based on a complementary metal-oxide semiconductor (CMOS) image sensor may be configured to produce images having a resolution of 600×400 pixels. Creating a different filter using a different center frequency for each pixel would produce a high resolution image sensor. However, altering the height of the filter for each pixel, thereby changing the center frequency of each filter, is not cost effective or practical from a manufacturing standpoint.

Figure 2:
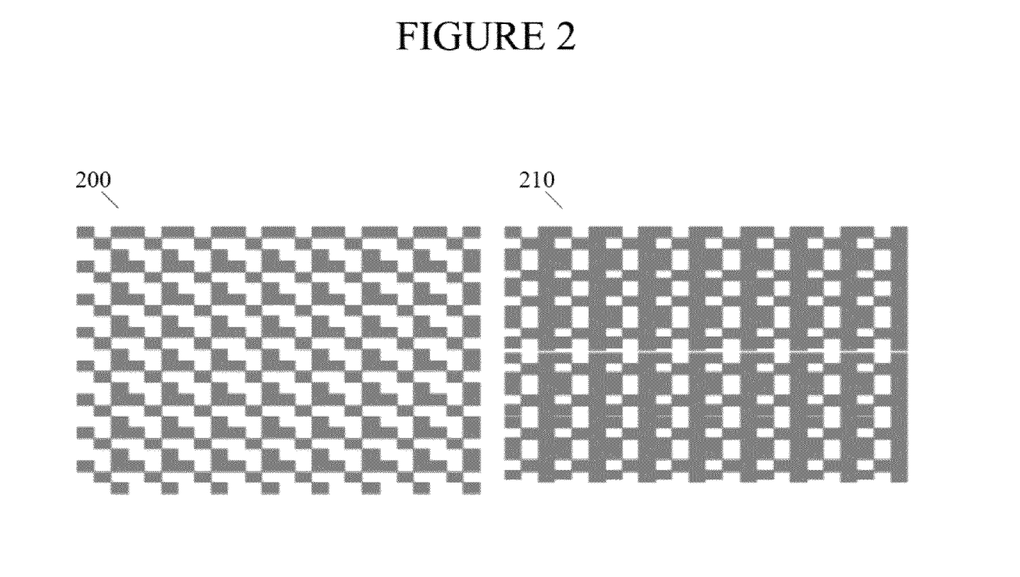
FIG. 2 depicts examples of patterns for use in a bandpass filter according to embodiments.

An alternate method may be to provide interference in one of the layers so as to change the center frequency of the filter while maintaining a constant filter height. FIG. 2 shows illustrative patterns 200, 210 that may be applied to a spacer layer, such as spacer layer 106 shown in FIG. 1. A pattern may be applied such that the effective refractive index of the spacer layer, and thus the filter, is changed. The pattern may be applied at a resolution below a diffraction limit of the target wavelength. The pattern may be applied via a lithographic or etching process. For example, state of the art 22 nm lithography may be used to apply the pattern to the spacer layer. Similarly, acid etching may be used to apply the pattern.

As shown in FIG. 2, each pattern may be defined by a base or sub-pattern of n pixels, where the base pattern repeated throughout the entire pattern. As shown in patterns 200 and 210, the base pattern may be a 3-pixel by 3-pixel square. A resulting refractive index of the spacer layer may be determined by determining a sum of i) the product of an average area of the pattern and a refractive index of the pattern material and ii) a product of the negative area of the pattern and the refractive index of the cover material. Expressed as an equation, the refractive index of the spacer layer is equal to $[(P*N_1)+((1-P)*N_2)]$, where P is a surface area of the portion of the patterned layer that comprises the pattern; $N_1$ is a refractive index of the first material; and $N_2$ is a refractive index of the second material.

For example, if a filter is made using silicon nitride (refractive index=2) for the spacer layer and silicon oxide (refractive index=1.44) for the cover layer, and the pattern has 75% coverage, then the effective refractive index of the patterned spacer layer would equal $[(0.75*2)+(0.25*1.44)]=1.86$.

As such, by choosing appropriate materials and an appropriate pattern coverage, one can form a filter having a refractive index that is of any value between the refractive indices of the two materials. For example, a 100% pattern of a silicon nitride has a refractive index of 2, a 100% pattern of silicon oxide (i.e., 0% pattern of silicon nitride) has a refractive index of 1.44, and, as shown above, a 75% pattern of silicon nitride has a refractive index of 1.86. Additional values for an effective refractive index may also be achieved by using alternate pattern coverages.

The resolution of a filter may be defined by the base pattern, and the base pattern may be variably sized depending on the intended application of the filter. However, the size of the base pattern may be limited in that the size of individual pixels of the base pattern may be smaller than a diffraction limit of the wavelength of interest.

Figure 3:
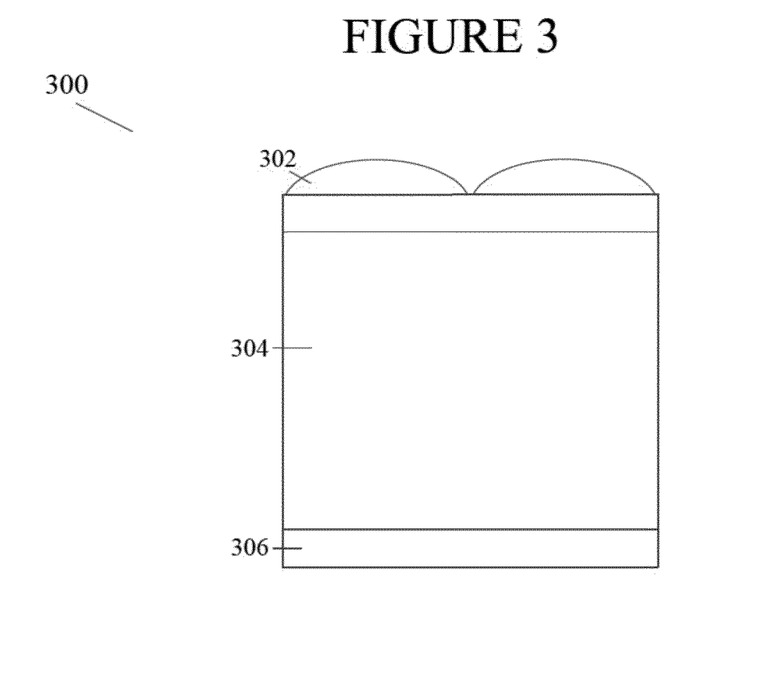
FIG. 3 depicts a stacked filter according to an embodiment.

To manufacture such a filter, standard CMOS fabrication techniques may be used. A manufacturer may pattern the spacer layer using a state of the art lithography tool integrated into a conventional CMOS assembly line. FIG. 3 illustrates an example of a completed sensor assembly 300. The assembly may include one or more microlenses 302 layered on top of the stacked filter assembly 304. The stacked filter assembly 304 may be mounted on a silicon wafer or component 306. For example, the silicon component 306 may be an image sensor. It should be noted that silicon component 306 is shown by way of example only. Additional and/or alternate materials, such as germanium, may also be used for the base of the assembly 300.

Figure 4:
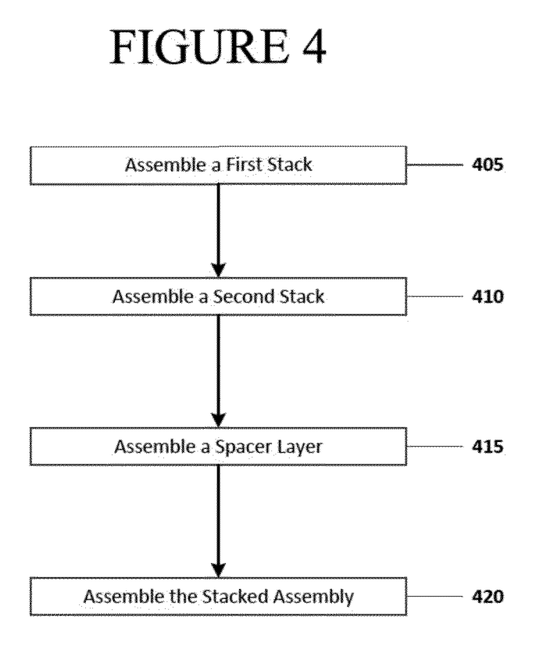
FIG. 4 depicts a flow diagram of an illustrative method of assembling a bandpass filter according to an embodiment.

FIG. 4 depicts a flow diagram of an illustrative method of assembling an optical filter for filtering a wavelength of interest by manufacturer according to traditional fabrication techniques. The process may include the manufacturer assembling 405 a first stack. As discussed above, the first stack may include alternating layers of a first material having a first refractive index and a second material having a second refractive index. For example, materials with a high refractive index may include silicon nitride, titanium dioxide, zinc oxide, aluminum oxide, and/or other similar materials with a high refractive index. Materials with a low refractive index may include silicon dioxide, cryolite, polycarbonate, and/or other similar materials with a low refractive index.

The manufacturer may further assemble 410 a second stack. Similar to the first stack, the second stack may include alternating layers of the first material and the second material. The manufacturer may assemble 415 a spacer layer configured to filter the wavelength of interest. As discussed above, the spacer layer may include a pattern.

It should be noted that assembly 405 of the first stack, assembly 410 of the second stack, and assembly 415 of the spacer layer are shown in a linear path in FIG. 4. However, during fabrication, the manufacturer may perform the assemblies simultaneously. Additionally, the assemblies may be performed in large batches and stored until the filters are assembled.

The manufacturer may assemble 420 a stacked assembly by arranging the first stack, the second stack, and the spacer layer such that the spacer layer is positioned between the first stack and the second stack. The stacked assembly may be bonded together using a transparent adhesive that does not interfere with the optical qualities of the assembly. Alternatively, the spacer layer may be heated such that the material used to manufacture the spacer layer softens and binds to the first stack and second stack.

Figure 5:
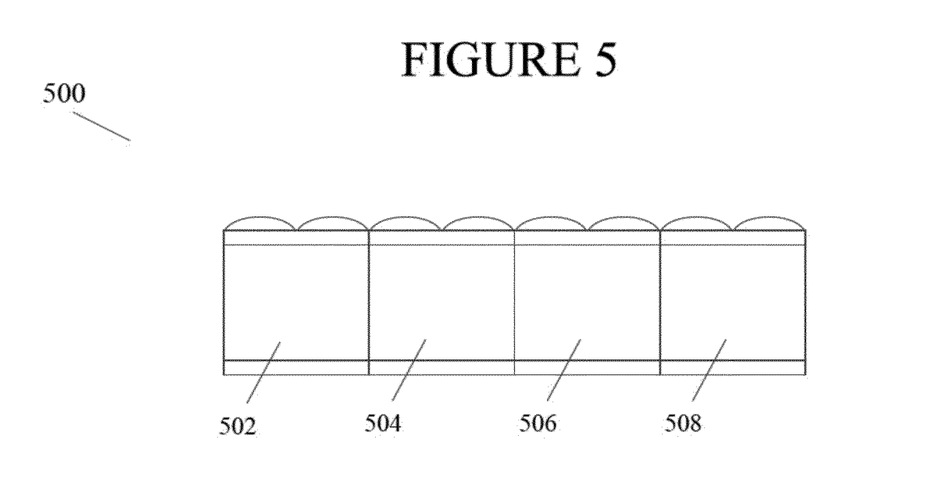
FIG. 5 depicts an image sensor array according to an embodiment.

FIG. 5 illustrates an image sensor array 500. Multiple assemblies 502, 504, 506 and 508 may be positioned adjacent one another to form a multi-pixel array. The individual assemblies may have varying patterned spacer layers and, as such each individual pixel may be configured to filter a different wavelength of interest, thus resulting in a high-resolution, low-cost sensor array.

It should be noted the embodiments as shown in the figures are shown by way of example only. Additional changes/improvements to the embodiments as discussed herein may be made. For example, the assembly process as shown in FIG. 4 is shown by way of example only. Additionally, the two patterns 200, 210 as shown in FIG. 2 are shown by way of example only and additional and/or alternate patterns may be used within the scope of this disclosure.

In an embodiment, an optical filter for filtering a selected wavelength may include a pixelated matrix layer that includes a set of first pixels comprising a first material having a first refractive index and a set of second pixels comprising a second material having a second refractive index that differs from the first refractive index. In an embodiment, each pixel may be smaller than a diffraction limit. In an embodiment, the selected wavelength is about 600 nm to about 900 nm. In an embodiment, the first material may include at least one of silicon nitride, titanium dioxide, zinc oxide, and aluminum oxide. In an embodiment, the second material may include at least one silicon dioxide, cryolite and polycarbonate.

In an embodiment, the pixelated matrix layer may have a thickness equal to about one-half of the selected wavelength. In an embodiment, the pixelated matrix layer may have a surface area. The set of first pixels may be present at a first fractional distribution of the surface area, and the set of second pixels may be present at a second fractional distribution of the surface area. The sum of the first fractional distribution and the second fractional distribution is equal to one. The pixelated matrix layer may have an effective refractive index that is equal to the sum of the product of the first refractive index and the first fractional distribution and the product of the second refractive index and the second fractional distribution.

In an embodiment, the sets of pixels may be arranged in a repeating pattern in the pixelated matrix layer. In an alternate embodiment, the sets of pixels may be arranged in a random manner in the pixelated matrix layer.

In an embodiment, each pixel may be square shaped. In alternate embodiments, one or more pixels may be triangularly shaped, hexagonally shaped, diamond shaped or any other shape that permits close packing of the pixels. In an embodiment, each pixel may have a side length of about 1 micron to about 10 microns.

In an embodiment, an optical filter for filtering a selected wavelength may include a pixelated matrix layer that includes a plurality of sets of pixels. Each set of pixels may be formed from a different material having a corresponding refractive index. The refractive index of each material may differ from the other materials. In such an embodiment, the pixelated matrix layer may have a surface area, and each set of pixels may be present at a fractional distribution of the surface area, such that the sum of the fractional distributions of the surface area for the sets of pixels is equal to one. The pixelated matrix layer may have an effective refractive index that is equal to the sum of the products, for each set of pixels, of the refractive index for the set of pixels and the fractional distribution for the set of pixels. In other words, the pixelated matrix layer may have an effective refractive index equal to $$\sum_{i=1}^{k} FD_i * N_i,$$

where k is the number of sets of pixels, $FD_i$ is the fractional distribution for the $i^{th}$ set of pixels, and $N_i$ is the refractive index for the $i^{th}$ set of pixels. As a further constraint, the sum of the fractional distributions is 1

$$\left(\text{i.e.,} \sum_{i=1}^{k} FD_i = 1\right).$$

EXAMPLES

Example 1

Handheld Device

A high resolution, small scale and relatively cheap sensor array will be produced, resulting in a smaller, lower cost spectroscope that can be incorporated into a handheld device for portable use. The handheld device will include a printed circuit board including two or more tunable laser diodes, at least one laser diode optically connected to a lens or other similar focusing device and configured to direct radiation through the optic fiber to the lens, which focuses the radiation toward a sample to be analyzed, and at least one laser diode configured to scan a range to produce a reference signal. The printed circuit board will also include an optical sensor optically connected to the scanning laser diode and the lens via optic fibers, a processor including a memory having instructions for performing chemical analysis of a sample, and a display for outputting information related to the chemical analysis of a sample. The handheld device will further include a user input interface, providing the user with the ability to enter information related to the sample to be analyzed. The small scale spectroscope will be integrated into existing handheld devices, such as smartphones.

Example 2

Use of Handheld Device to Detect Water Pollution

A government agency, such as a national parks department, will use the portable device described in Example 1 to test pollution levels at various areas of a national park. A park ranger or other similar employee of the parks department will travel the length of a river passing through a national park and test the water at various points along the length for contaminants with the portable device of Example 1 operating as a Raman spectroscopy detector. The information will be used to determine whether unwanted pollutants are passing through the river, potentially harming fish or wildlife.

Example 3

Use of Handheld Device to Detect Well Contamination

A homeowner who obtains drinking water from a well or other natural resource will use a portable, handheld Raman spectroscopy detector, such as is described in Example 1, to determine whether the drinking water supply has any unwanted contaminants, and whether they need to filter or otherwise treat their drinking water supply. The homeowner will prepare a sample from the drinking water supply and test the sample for contaminants with the portable device of Example 1 operating as a Raman spectroscopy detector. The information will be used to determine whether unwanted pollutants are present in the drinking water supply.

Example 4

Medication Production

In a typical medication production facility, maintaining a clean work environment and preventing any unwanted materials from entering the production process are of great concern. The presently disclosed filter assembly results in a smaller, cheaper spectroscope that uses a small scale, high resolution sensor array.

As such, multiple Raman spectroscopy devices, such as are described above in Example 1, will be placed at various positions along a production line to ensure that no unwanted materials are present in the medication during production. A set of tunable lasers, including a first tunable laser and a second scanning laser, will be positioned along the assembly line such that a laser light is directed into the medication ingredients or mixtures as they pass the lasers. A modulated signal produced by the laser light reacting with the medication ingredients will be locally collected at each set of lasers, combined with a reference signal produced by the scanning laser at a local non-liner mixer, and transmitted as an electrical signal to a central location for further analysis. A central processor will receive the signals from multiple devices along the production line, determine the chemical composition at the various positions along the assembly line, and report any abnormalities or unexpected results to an operator at the central locations.

Specifically, prior to each ingredient being added to a specific medication, a Raman sample will be taken of the medication as it passes down the production line to verify that the composition of the medication is limited to desired ingredients. A similar process will be performed after each ingredient is added to ensure that only desired materials were added. Similarly, as a supply of one or more ingredients are received or added to the production line, the chemical composition of the ingredients will be confirmed to ensure that no unwanted materials enter the production line.

Example 5

Use of Handheld Device in Pharmacy

An individual pharmacist will use a handheld Raman spectroscopy device described above in Example 1, to verify that medication received from vendors is authentic and does not contain any unwanted materials. The spectroscopy device will assist in preventing counterfeit drugs that differ from authentic medications from being sold to customers.

Example 6

Filter for Visible Wavelengths

A spectrometer designed to operate in the 400-800 nm range and useful for identifying various organic substances as defined in the previous examples will use a standard CMOS imager chip, such as a 1.3 Megapixel imager having 1.3 million sensors having a maximum attainable resolution of (800 nm-400 nm)/1.3M sensors=0.3 pm/sensor, as a photo diode array. A combination of 4 pixels per wavelength will be used to attain a resolution of 1.2 pm.

Each pixel of the imager chip will have a filter structure tuned to a different center frequency. All the filters/pixels will have the same broadband, alternating stack structure. This structure will be used to provide the top and bottom reflective elements, which will be designed using standard thin filter design algorithms. The reflective elements will be designed to have a constant reflectivity of at least 99% over the range of 400-800 nm. The spacer layer will have a thickness of 140 nm and a center frequency in the range of 400 to 800 nm. The effective refractive index will be between 1.42, which is the refractive index of $SiO_2$, and 2.8, which is achievable using a high index material such as GaAs, or Si.

Example 7

Manufacture of Visible Wavelength Filter

The sensor described in Example 6 will be manufactured in a standard CMOS fabrication. After fabricating an image sensor wafer, the bottom reflector layer stack will be deposited onto the sensor wafer. The lower refractive index material (i.e., $SiO_2$ in Example 6) will be deposited onto the bottom reflector layer stack. The higher refractive index material (i.e., GaAs or Si in Example 6) is deposited and patterned onto the lower refractive index material. The pattern to be applied enables the spacer layer to attain the required effective refractive index. The top reflector layer stack will be deposited on the spacer layer, and the CMOS chips will be singulated. The dies will be packaged with electronics wires connected to the die pads, and a lens and other optical elements positioned on top of the image sensors.

In the above detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be used, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). While various compositions, methods, and devices are described in terms of "comprising" various components or steps (interpreted as meaning "including, but not limited to"), the compositions, methods, and devices can also "consist essentially of" or "consist of" the various components and steps, and such terminology should be interpreted as defining essentially closed-member groups. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An optical filter for filtering a wavelength of interest, the optical filter comprising:
   a first stack comprising alternating layers of a first material having a first refractive index and a second material having a second refractive index, wherein the first refractive index and the second refractive index are different;
   a second stack comprising alternating layers of the first material and the second material; and
   a spacer layer positioned between the first stack and the second stack to form a stacked assembly, wherein the spacer layer comprises a patterned layer comprising the first material and the second material, wherein at least a portion of the patterned layer comprises a uniformly repeating pattern composed of the first material, wherein an effective refractive index of the spacer layer at the wavelength of interest is determined based on a percentage of the patterned layer covered by the pattern, the first refractive index, and the second refractive index.

2. The optical filter of claim 1, wherein the pattern is a lithographic pattern.

3. The optical filter of claim 1, wherein the pattern is an etched pattern.

4. The optical filter of claim 1, wherein each of the alternating layers of the first material and the second material comprises a thickness equal to ¼ the wavelength of interest.

5. The optical filter of claim 1, wherein:
   the first stack comprises a plurality of layers of the first material and a plurality of layers of the second material, alternatively arranged such that each layer of the second material is between layers of the first material;
   the second stack comprises a plurality of layers of the first material and a plurality of layers of the second material, alternatively arranged such that each layer of the second material is between layers of the first material; and
   the spacer layer is positioned adjacent to a layer of the first material from the first stack and adjacent to a layer of the first material from the second stack to form the stacked assembly.

6. The optical filter of claim 1, wherein the pattern comprises a plurality of sub-patterns, each sub-pattern comprising a plurality of pixels smaller than a diffraction limit of the wavelength of interest.

7. The optical filter of claim 1, wherein the first material comprises at least one of silicon nitride, titanium dioxide, zinc oxide, and aluminum oxide.

8. The optical filter of claim 1, wherein the second material comprises at least one of silicon dioxide, cryolite and polycarbonate.

9. A method of assembling an optical filter for filtering a wavelength of interest, the method comprising:
assembling a first stack comprising alternating layers of a first material having a first refractive index and a second material having a second refractive index, wherein the first refractive index and the second refractive index are different;
assembling a second stack comprising alternating layers of the first material and the second material;
assembling a spacer layer configured to filter the wavelength of interest, wherein the spacer layer comprises a patterned layer comprising the first material and the second material, wherein at least a portion of the patterned layer comprises a uniformly repeating pattern composed of the first material, wherein an effective refractive index of the spacer layer at the wavelength of interest is determined based on a percentage of the patterned layer covered by the pattern, the first refractive index, and the second refractive index; and
assembling a stacked assembly comprising the first stack, the second stack, and the spacer layer positioned between the first stack and the second stack.

10. The method of claim 9, further comprising applying the pattern to at least a portion of the patterned layer through a lithographic process.

11. The method of claim 9, further comprising applying the pattern to at least a portion of the patterned layer through and etching process.

12. The method of claim 9, wherein assembling the first stack comprises assembling the first stack such that each of the alternating layers of the first material and the second material comprises a thickness equal to ¼ the wavelength of interest, and
wherein assembling the second stack comprises assembling the second stack such that each of the alternating layers of the first material and the second material comprises a thickness equal to ¼ the wavelength of interest.

13. The method of claim 9, wherein assembling a spacer layer comprises assembling a spacer layer having a pattern comprising a plurality of sub-patterns, each sub-pattern comprising a plurality of pixels smaller than a diffraction limit of the wavelength of interest.

14. The method of claim 9, wherein the first material comprises at least one of silicon nitride, titanium dioxide, zinc oxide, and aluminum oxide.

15. The method of claim 9, wherein the second material comprises at least one of silicon dioxide, cryolite, and polycarbonate.

16. An image sensor array comprising:
a plurality of photodiodes;
a plurality of lenses, wherein each of the photodiodes corresponds to at least one of the plurality of lenses; and
a plurality of filters, wherein each of the lenses corresponds to at least one of the plurality of filters, each of the filters comprising:
a first stack comprising alternating layers of a first material having a first refractive index and a second material having a second refractive index, wherein the first refractive index and the second refractive index are different,
a second stack comprising alternating layers of the first material and the second material, and
a spacer layer positioned between the first stack and the second stack to form a stacked assembly, wherein the spacer layer comprises a patterned layer comprising the first material and the second material, wherein at least a portion of the patterned layer comprises a uniformly repeating pattern composed of the first material, wherein an effective refractive index of the spacer layer at the wavelength of interest is determined based on a percentage of the patterned layer covered by the pattern, the first refractive index, and the second refractive index,
wherein the spacer layer is configured to filter the wavelength of interest.

17. The image sensor array of claim 16, wherein the pattern is a lithographic pattern.

18. The image sensor array of claim 16, wherein the pattern is an etched pattern.

19. The image sensor array of claim 16, wherein:
the first stack comprises a plurality of layers of the first material and a plurality of layers of the second material, alternatively arranged such that each layer of the second material is between layers of the first material;
the second stack comprises a plurality of layers of the first material and a plurality of layers of the second material, alternatively arranged such that each layer of the second material is between layers of the first material; and
the spacer layer is positioned adjacent to a layer of the first material from the first stack and adjacent to a layer of the first material from the second stack to form the stacked assembly.

20. The image sensor array of claim 16, wherein the pattern comprises a plurality of sub-patterns, each sub-pattern comprising a plurality of pixels smaller than a diffraction limit of the wavelength of interest.

21. The image sensor array of claim 16, wherein the first material comprises at least one of silicon nitride, titanium dioxide, zinc oxide, and aluminum oxide.

22. The image sensor array of claim 16, wherein the second material comprises at least one of silicon dioxide, cryolite, and polycarbonate.

23. A system comprising:
a first lens configured to:
receive incoming light,
focus the incoming light, and
transmit the focused light;
an image sensor array positioned adjacent the first lens and configured to receive the focused light and output information related to the focused light, the image sensor array comprising:
a plurality of photodiodes,
a plurality of second lenses, wherein each of the photodiodes corresponds to at least one of the plurality of second lenses, and
a plurality of filters, wherein each of the second lenses corresponds to at least one of the plurality of filters, each of the filters comprising:
a first stack comprising alternating layers of a first material having a first refractive index and a second material having a second refractive index, wherein the first refractive index and the second refractive index are different,
a second stack comprising alternating layers of the first material and the second material, and
a spacer layer positioned between the first stack and the second stack to form a stacked assembly, wherein the spacer layer comprises a patterned layer comprising the first material and the second material, wherein at least a portion of the patterned layer comprises a uniformly repeating pattern composed of the first material, wherein an effective refractive index of the spacer layer at the wavelength of interest is determined based on a percentage of the patterned layer covered by the pattern, the first refractive index, and the second refractive index, wherein the spacer layer is configured to filter the wavelength of interest; and a processing device operably connected to the image sensor array and configured to:
receive the output information related to the focused light, and
generate an image based upon the output information.

24. The system of claim 23, wherein the pattern is a lithographic pattern.

25. The system of claim 23, wherein the pattern is an etched pattern.

26. The system of claim 23, wherein:
the first stack comprises a plurality of layers of the first material and a plurality of layers of the second material, alternatively arranged such that each layer of the second material is between layers of the first material;
the second stack comprises a plurality of layers of the first material and a plurality of layers of the second material, alternatively arranged such that each layer of the second material is between layers of the first material; and
the spacer layer is positioned adjacent to a layer of the first material from the first stack and adjacent to a layer of the first material from the second stack to form the stacked assembly.

27. The system of claim 23, wherein the pattern comprises a plurality of sub-patterns, each sub-pattern comprising a plurality of pixels smaller than a diffraction limit of the wavelength of interest.

28. The system of claim 23, wherein the first material comprises at least one of silicon nitride, titanium dioxide, zinc oxide, and aluminum oxide.

29. The system of claim 23, wherein the second material comprises at least one of silicon dioxide, cryolite and polycarbonate.

* * * * *